(12) United States Patent
Zeng et al.

(10) Patent No.: US 11,677,055 B2
(45) Date of Patent: Jun. 13, 2023

(54) LIGHT EMITTING DEVICE AND LIGHT EMITTING APPARATUS

(71) Applicant: Xiamen San'an Optoelectronics Technology Co., Ltd., Xiamen (CN)

(72) Inventors: Xiaoqiang Zeng, Xiamen (CN); Shao-Hua Huang, Xiamen (CN); Jianfeng Yang, Xiamen (CN); Lixun Yang, Xiamen (CN)

(73) Assignee: Xiamen San'an Optoelectronics Technology Co., Ltd., Xiamen (CN)

( * ) Notice: Subject to any disclaimer, the term of this patent is extended or adjusted under 35 U.S.C. 154(b) by 243 days.

(21) Appl. No.: 16/787,910

(22) Filed: Feb. 11, 2020

(65) Prior Publication Data

US 2020/0395522 A1    Dec. 17, 2020

(30) Foreign Application Priority Data

Jun. 11, 2019   (CN) .......................... 201910502017.X

(51) Int. Cl.

| | |
|---|---|
| *H01L 33/00* | (2010.01) |
| *H01L 33/62* | (2010.01) |
| *H01L 33/22* | (2010.01) |
| *H01L 33/40* | (2010.01) |
| *H01L 33/48* | (2010.01) |
| *H01L 33/50* | (2010.01) |

(52) U.S. Cl.
CPC .............. *H01L 33/62* (2013.01); *H01L 33/22* (2013.01); *H01L 33/405* (2013.01); *H01L 33/486* (2013.01); *H01L 33/50* (2013.01)

(58) Field of Classification Search
CPC ... H01L 23/49833; H01L 33/62; H01L 33/22; H01L 33/405; H01L 33/486; H01L 33/50; H01L 25/0753; H01L 33/60; H01L 2224/18; H01L 29/861; H01L 23/49; H01L 23/49503; H01L 25/072; H01L 23/22

USPC .............................................. 257/91; 438/22
See application file for complete search history.

(56) References Cited

U.S. PATENT DOCUMENTS

| | | | | |
|---|---|---|---|---|
| 8,884,312 | B2 * | 11/2014 | Moon ..................... | H01L 33/64 438/22 |
| 9,142,748 | B2 * | 9/2015 | Ohmae ................. | H01L 27/156 |
| 10,109,780 | B2 * | 10/2018 | Herrmann ............. | H01L 25/167 |
| 10,403,537 | B2 * | 9/2019 | Henry ................. | H01L 27/1214 |
| 2011/0272728 | A1 * | 11/2011 | Rode ..................... | H01L 25/167 257/E33.062 |

(Continued)

*Primary Examiner* — Didarul A Mazumder

(74) *Attorney, Agent, or Firm* — Thomas | Horstemeyer, LLP

(57) ABSTRACT

A light emitting device includes at least one light emitting and connecting unit that includes an epitaxial layer structure and a metallic connecting layer structure, and an insulating substrate that has a main substrate body and first and second contact members. The connecting layer structure interconnects the epitaxial layer structure and the main substrate body, and is completely plane at least right under the epitaxial layer structure. The contact members extend from a first surface to a second surface on the main substrate body, and are disposed outside an imaginary projection of the epitaxial layer structure on the main substrate body. The first contact member is electrically connected with the connecting layer structure. A light emitting apparatus including the device is also disclosed.

20 Claims, 3 Drawing Sheets

(56) References Cited

U.S. PATENT DOCUMENTS

2014/0048838 A1* 2/2014 Yang .................... H01L 33/382
                                                                                  438/42
2014/0246648 A1* 9/2014 Im ....................... H01L 33/382
                                                                                   257/13

\* cited by examiner

LIGHT EMITTING DEVICE AND LIGHT EMITTING APPARATUS

CROSS-REFERENCE TO RELATED APPLICATION

This application claims priority of Chinese Patent Application No. 201910502017.X, filed on Jun. 11, 2019.

FIELD

The disclosure relates to a light emitting device, and more particularly to a surface-mount light emitting device and a light emitting apparatus including the same.

BACKGROUND

Light emitting diodes (LEDs) have been widely used as solid-state light sources. Compared to traditional light sources such as incandescent light bulbs and fluorescent lamps, LEDs have several advantages, for instance, low power consumption, long service life, etc. Therefore, LEDs have gradually replaced traditional light sources, and have been used in various fields such as traffic lights, backlight modules, street lighting, medical equipments, and so forth.

CN 102428581 A discloses a surface-mount optoelectronic component which comprises a semiconductor body having an epitaxial layer sequence. During the production process of the optoelectronic component, a growth substrate used for growth of the epitaxial layer sequence is detached after soldering connection of the semiconductor body to a carrier substrate which is different from the growth substrate. In the optoelectronic component, a solder layer for the solder connection between the semiconductor body and the carrier substrate has cavities therein. Normally, an insulating material is disposed in the cavities of the solder layer to support the structure of the solder layer. However, due to the stress mismatch between the insulating material and the epitaxial layer sequence, breakage of the epitaxial layer sequence might occur. In addition, cutouts are formed in the carrier substrate underneath the solder layer and the epitaxial layer sequence for electrically conductive connection layers to extend therethrough, such that the solder connection by the solder layer might be compromised due to such cutouts. Accordingly, the epitaxial layer sequence might be susceptible to breakage.

SUMMARY

Therefore, an object of the disclosure is to provide a light emitting device and a light emitting apparatus that can alleviate at least one of the drawbacks of the prior art.

The light emitting device includes at least one light emitting and connecting unit and an insulating substrate. The at least one light emitting and connecting unit includes an epitaxial layer structure that includes an active layer, and a metallic connecting layer structure. The insulating substrate includes a main substrate body that has a first surface and a second surface opposite to each other, and a first contact member and a second contact member that each extend from the first surface to the second surface. The metallic connecting layer structure is interposed between and interconnects the epitaxial layer structure and the first surface of the main substrate body of the insulating substrate. The metallic connecting layer structure is completely plane at least right under the epitaxial layer structure. The first contact member of the insulating substrate is electrically connected with the metallic connecting layer structure. The first and second contact members are disposed outside an imaginary projection of the epitaxial layer structure on the main substrate body of the insulating substrate.

The light emitting apparatus includes at least one light emitting device as described above and a supporting member that the at least one light emitting device is surface-mounted thereon.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
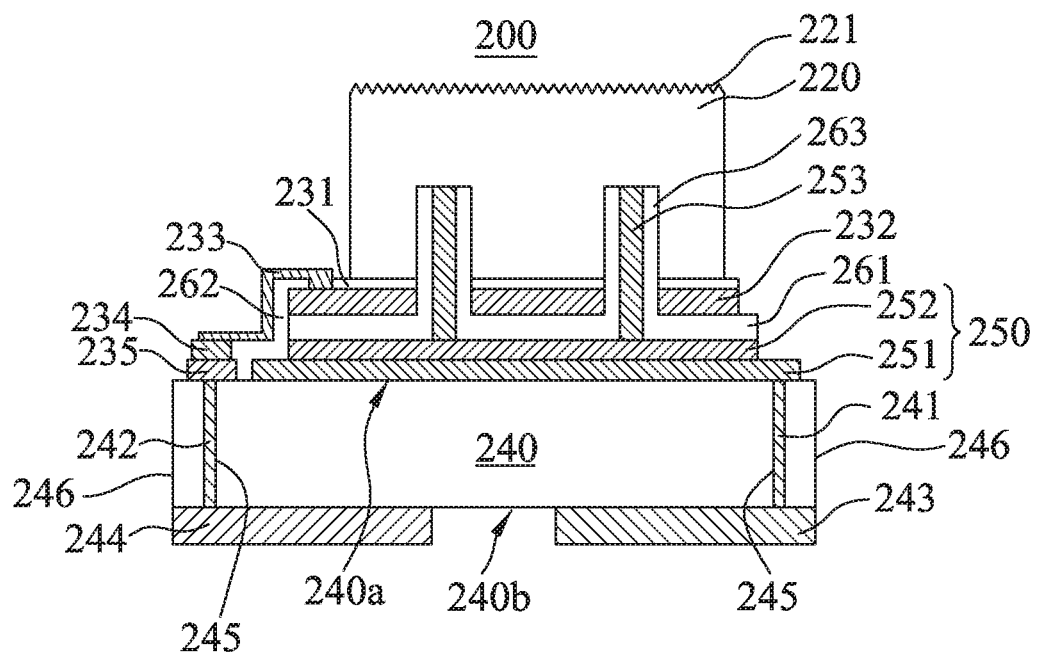
FIG. 1 is a schematic sectional view illustrating a first embodiment of a light emitting device according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a light emitting device 200 according to the present disclosure includes a light emitting and connecting unit and an insulating substrate 240. The light emitting and connecting unit includes an epitaxial layer structure 220 and a metallic connecting layer structure 250.

The insulating substrate 240 includes a main substrate body that has a first surface 240*a* and a second surface 240*b* that are opposite to each other to respectively face toward and away from the epitaxial layer structure 220, and a first contact member 241 and a second contact member 242 that each extend from the first surface 240*a* to the second surface 240*b*, and that are separated from each other. The first contact member 241 of the insulating substrate 240 is electrically connected with the metallic connecting layer structure 250.

The metallic connecting layer structure 250 is interposed between and interconnects the epitaxial layer structure 220 and the first surface 240*a* of the main substrate body of the insulating substrate 240. The metallic connecting layer structure 250 is completely plane at least right under the epitaxial layer structure 220. Namely, a portion of the metallic connecting layer structure 250 not disposed right under the epitaxial layer structure 220 may be non-plane.

The epitaxial layer structure 220 may be made from, for example, a nitride-based semiconductor material or an AlGaInP-based semiconductor material. The epitaxial layer structure 220 includes a first-type semiconductor layer, a second-type semiconductor layer, and an active layer disposed between the first-type semiconductor layer and the second-type semiconductor layer (not shown in the drawing). The active layer is able to generate radiation. In this embodiment, the first-type semiconductor layer and the second-type semiconductor layer are disposed distal from and proximal to the insulating substrate 240, respectively.

The term "first-type" refers to being doped with a first conductivity type dopant, and the term "second-type" refers to being doped with a second conductivity type dopant that is opposite in conductivity type to the first conductivity type dopant. For instance, the first conductivity type dopant may be a p-type dopant, and the second conductivity type dopant may be an n-type dopant, and vice versa.

The epitaxial layer structure 220 has a light emitting surface 221 and a back surface which is opposite thereto, and which is for connection with the metallic connecting layer structure 250. In this embodiment, the light emitting surface 221 is roughened or provided with a structured member to enhance the light extraction efficiency. Roughening or forming the structured member on the light emitting surface 221 may be conducted through etching.

In this embodiment, the epitaxial layer structure 220 is not attached to a growth substrate, which means that the growth substrate for growing the epitaxial layer structure 220 has been removed therefrom. Alternatively, in other embodiments, the epitaxial layer structure 220 may be attached to a growth substrate which has been greatly reduced in thickness.

During the production of the light emitting device 200, connection of the epitaxial layer structure 220 with the insulating substrate 240 may be conducted before removal of the growth substrate from the light emitting surface 221 of the epitaxial layer structure 220. The insulating substrate 240, which is not required to epitaxially grow the epitaxial layer structure 220 like the growth substrate, can be made from a wider range of materials compared to the growth substrate.

The metallic connecting layer structure 250 includes a first metallic layer 251 which is disposed on the first surface 240a of the main substrate body of the insulating substrate 240, and a second metallic layer 252 which is disposed on the first metallic layer 251 opposite to the main substrate body of the insulating substrate 240. The first metallic layer 251 may be a continuously flat and solid plate formed on the first surface 240a of the main substrate body of the insulating substrate 240, which may be a flat surface, and the second metallic layer 252 may also be a continuously flat and solid plate. In this embodiment, the back surface of the epitaxial layer structure 220 is entirely and indirectly disposed on the second metallic layer 252.

The first and second metallic layers 251, 252 may be made from the same material or different materials. The first metallic layer 251 may be made from a metallic material selected from the group consisting of Cu, Au, Sn, Ni, Ti, In, and combinations thereof (e.g. alloys thereof). The second metallic layer 252 may be made from a metallic material selected from the group consisting of Au, Sn, Ni, Ti, In, and combinations thereof (e.g. alloys thereof).

Figure 2:
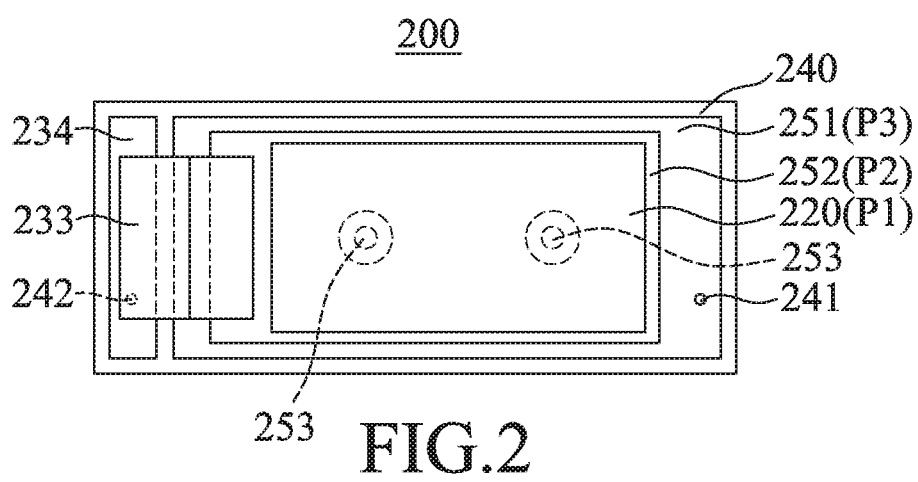
FIG. 2 is a schematic top view illustrating the first embodiment.

Referring to FIG. 2, an imaginary projection (P3) of the first metallic layer 251 on the main substrate body of the insulating substrate 240 may have an area that is not less than 90% of an area of the first surface 240a of the main substrate body of the insulating substrate 240. In this embodiment, an imaginary projection (P2) of the second metallic layer 252 on the main substrate body of the insulating substrate 240 covers and is larger in size than an imaginary projection (P1) of the epitaxial layer structure 220 on the main substrate body of the insulating substrate 240, and the imaginary projection (P3) of the first metallic layer 251 on the main substrate body of the insulating substrate 240 covers and is larger in size than the imaginary projection (P2) of the second metallic layer 252 on the main substrate body of the insulating substrate 240. Alternatively, in other embodiments, the imaginary projection (P2) of the second metallic layer 252 on the main substrate body of the insulating substrate 240 covers and is equal in size to the imaginary projection (P1) of the epitaxial layer structure 220 on the main substrate body of the insulating substrate 240, and/or the imaginary projection (P3) of the first metallic layer 251 on the main substrate body of the insulating substrate 240 covers and is equal in size to the imaginary projection (P2) of the second metallic layer 252 on the main substrate body of the insulating substrate 240.

The first and second contact members 241, 242 are disposed outside the imaginary projection (P1) of the epitaxial layer structure 220 on the main substrate body of the insulating substrate 240. Referring back to FIG. 1, the second surface 240b of the main substrate body of the insulating substrate 240 is provided with a first welding electrode 243 which is electrically connected with the first contact member 241, and a second welding electrode 244 which is spaced apart from the first welding electrode 243, and which is electrically connected with the second contact member 242.

In this embodiment, the main substrate body of the insulating substrate 240 has two through-holes 245 which extend through the main substrate body from the first surface 240a to the second surface 240b, and which are respectively for the first and second contact members 241, 242 to extend therethrough. The through-holes 245 may have a width ranging from 5 μm to 10 μm. Alternatively, in other embodiments, each of the first and second contact members 241, 242 extends along a respective one of lateral sides 246 of the main substrate body of the insulating substrate 240 (such lateral sides interconnect the first and second surfaces 240a, 240b) from the first surface 240a to the second surface 240b.

In this embodiment, the light emitting and connecting unit further includes two extension members 253 that extend from the second metallic layer 252 through the second-type semiconductor layer and the active layer of the epitaxial layer structure 220 to be electrically connected with the first-type semiconductor layer of the epitaxial layer structure 220. The extension members 253 are made from a metallic material such as Cr, Ti, Al, etc.

The second metallic layer 252 may be multilayered. For instance, the second metallic layer 252 may have a metallic reflection sublayer and a metallic connecting sublayer. A distance from the metallic reflection sublayer of the second metallic layer 252 to the light emitting surface 221 of the epitaxial layer structure 220 may be less than or equal to 20 μm (for example, 7 μm to 12 μm, 8 μm, 9 μm, or 12 μm).

The extension members 253 may be distributed evenly to have more satisfactory current spreading effect and heat dissipating effect. The extension members 253 are suitable for a driving current density of not less than 1.5 A/mm$^2$ (for instance, 2 A/mm$^2$, 3 A/mm$^2$, or 4 A/mm$^2$) A total contact area between the extension members 253 and the second-type semiconductor layer of the epitaxial layer structure 220 is larger than 1.5% of an area of the second-type semiconductor layer of the epitaxial layer structure 220. For instance, such total contact area may be 2.3% to 2.8%, 2.8% to 4%, or 4% to 6% of the area of the second-type semiconductor layer of the epitaxial layer structure 220.

Increase in the total contact area between the extension members 253 and the second-type semiconductor layer of the epitaxial layer structure 220 may enhance heat dissipating efficiency of the light emitting device 200 (particularly when the light emitting device 200 is designed to have a large size or to be a high-voltage type). Thus, the extension members 253 may have a width of not less than 15 µm. Even though the aforesaid increase in the total contact area may enhance the heat dissipating efficiency, the width of the extension members 253 may be optimized to achieve more satisfactory heat dissipating efficiency. For example, the width of the extension members 253 may range from 32 µm to 40 µm. When the width of the extension members 253 ranges from 34 µm to 36 µm, the extension members 253 may be distributed at a density of 20 to 25 extension members/mm².

The light emitting and connecting unit further includes a third metallic layer 232 that is disposed between the second metallic layer 252 and the epitaxial layer structure 220, and that is electrically connected with the second-type semiconductor layer of the epitaxial layer structure 220, and a lateral member 233 that is disposed laterally of the epitaxial layer structure 220, that extends from the third metallic layer 232 toward the second contact member 242, and that is electrically connected with the third metallic layer 232 and the second contact member 242 of the insulating substrate 240.

The third metallic layer 232 may be made from a material selected from the group consisting of Ag, Au, Ti, Al, Cr, Pt, TiW, Ni, and combinations thereof. Ag and Al are suitable metallic reflection materials. TiW is a suitable metallic coating material for preventing metal diffusion. Cr, Ni, and Au are suitable ohmic contact materials.

In this embodiment, the light emitting and connecting unit further includes a first insulation layer 261 that is disposed between the second and third metallic layers 252, 232, and that is for electrical insulation. Specifically, the third metallic layer 232, the first insulation layer 261, and the second metallic layer 252 are stacked on one another in a vertical direction, and the extension members 253 also extend through the insulation layer 261 and the third metallic layer 232.

In order to reduce the electrical resistance between the third metallic layer 232 and the second-type semiconductor layer of the epitaxial layer structure 220, in this embodiment, the light emitting and connecting unit further includes a transparent current spreading layer 231 disposed between the third metallic layer 232 and the epitaxial layer structure 220.

In this embodiment, the light emitting and connecting unit further includes a fourth metallic layer 234 and a fifth metallic layer 235 that are disposed in such sequential order between the lateral member 233 and the first surface 240a of the main substrate body of the insulating substrate 240. The fourth metallic layer 234 may be made from a material the same as that of the second metallic layer 252, and the fifth metallic layer 235 may be made from a material the same as that of the first metallic layer 251. In other embodiments, one or both of the fourth and fifth metallic layers 234, 235 may be dispensed with.

In this embodiment, the light emitting and connecting unit further includes a second insulation layer 262 that is disposed over a lateral side of the second metallic layer 252, a lateral side of the first insulation layer 261, and a lateral side of the third metallic layer 232, and that is for electrical insulation. The lateral member 233 is disposed over the second insulation layer 262.

In this embodiment, the third metallic layer 232 may have a metallic reflection sublayer. A distance from the metallic reflection sublayer of the third metallic layer 232 to the light emitting surface 221 of the epitaxial layer structure 220 may be less than or equal to 10 µm (for example, 4 µm to 8 µm). Moreover, a distance from the metallic reflection sublayer of the third metallic layer 232 to the active layer of the epitaxial layer structure 220 may be less than or equal to 2 µm, such that a path of reflected light traveling inside the light emitting device 200 can be shortened, and such that light emitted from the active layer of the epitaxial layer structure 220 can be emitted from the light emitting surface 221 of the epitaxial layer structure 220 at a higher light emission rate.

In this embodiment, the light emitting device 200 may be configured to emit light at an angle of not greater than 150° (for instance, at an angle of not greater than 1200 such as an angle ranging from 110° to 120°, an angle of 113°, an angle of 115°, or an angle of 118°).

When each of the second and third metallic layers 252, 232 has a metallic reflection sublayer as described above, the back surface of the epitaxial layer structure 220 is sufficiently covered by the metallic reflection sublayers of the second and third metallic layers 252, 232, such that light emitted from the active layer of the epitaxial layer structure 220 and traveling downward can be reflected by these metallic reflection sublayers and will not be partially absorbed by the insulating substrate 240. For example, the third metallic layer 232 may have an Ag-based layer which serves as the metallic reflection sublayer thereof, and the second metallic layer 252 may have an Al-based layer which serves as the metallic reflection sublayer thereof, and which is in ohmic contact with the first-type semiconductor layer of the epitaxial layer structure 220. In addition, the Al-based layer of the second metallic layer 252 may serve to cover, if any, an area of the back surface of the epitaxial layer structure 220 not covered by the Ag-based layer of the third metallic layer 232.

The insulating substrate 240 may be made from an excellent heat dissipating material, such as a Si or ceramic material, and may have a thermal conductivity coefficient of not less than 150 W/(m·k) at 100° C. Since the metallic connecting layer structure 250 interconnects the insulating substrate 240 and the epitaxial layer structure 220, undesired heat can be transferred from the first-type semiconductor layer of the epitaxial layer structure 220 to the insulating substrate 240 through the metallic connecting layer structure 250 and hence can be dissipated by the insulating substrate 240. The undesired heat normally accumulates on the first-type semiconductor layer of the epitaxial layer structure 220 since stimulated emission by multiple quantum wells occurs on the first-type semiconductor layer of the epitaxial layer structure 220.

The advantages of the light emitting device 200 according to the present disclosure are described below.

Since the metallic connecting layer structure 250 is continuously flat and solid (i.e. not patterned), the connection between the epitaxial layer structure 220 and the insulating substrate 240 can be secured. Furthermore, the first and second contact members 241, 242 of the insulating substrate 240 are disposed outside the imaginary projection (P1) of the epitaxial layer structure 220 on the main substrate body of the insulating substrate 240, which means that the first and second contact members 241, 242 do not adversely affect the connection between the epitaxial layer structure 220 and the insulating substrate 240. Therefore, secure connection of the epitaxial layer structure 220 with the insulating substrate 240 can prevent breakage of the epitaxial layer structure 220.

Apart from the foregoing, since the metallic connecting layer structure 250 can serve to transfer heat from the first-type semiconductor layer of the epitaxial layer structure 220 to the insulating substrate 240 as described above, a high current density is applicable to the light emitting device 200 of the present disclosure.

Figure 3:
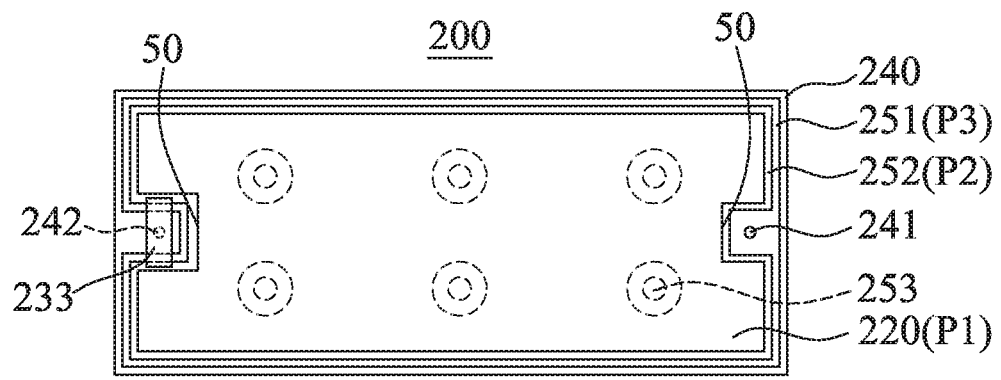
FIG. 3 is a schematic top view illustrating a second embodiment of the light emitting device according to the present disclosure.

Referring to FIG. 3, a second embodiment of the light emitting device 200 according to the present disclosure is shown, and is generally similar to the first embodiment except for the following differences.

In the second embodiment, the light emitting and connecting unit includes six extension members 253 as described above.

In the second embodiment, the imaginary projection (P1) of the epitaxial layer structure 220 on the main substrate body of the insulating substrate 240 is enlarged to an extent that the imaginary projection (P1) of the epitaxial layer structure 220 still does not overlap the first and second contact members 241, 242 of the insulating substrate 240. To be specific, the imaginary projection (P1) of the epitaxial layer structure 220 has two lateral recesses 50 so as to steer clear of the first and second contact members 241, 242 of the insulating substrate 240. Namely, compared to the first embodiment, the epitaxial layer structure 220 has a larger size, and the ratio of the area of the light emitting surface 221 of the epitaxial layer structure 220 to the total area of the light emitting device 200 is increased. Therefore, light extraction can be enhanced.

Figure 4:
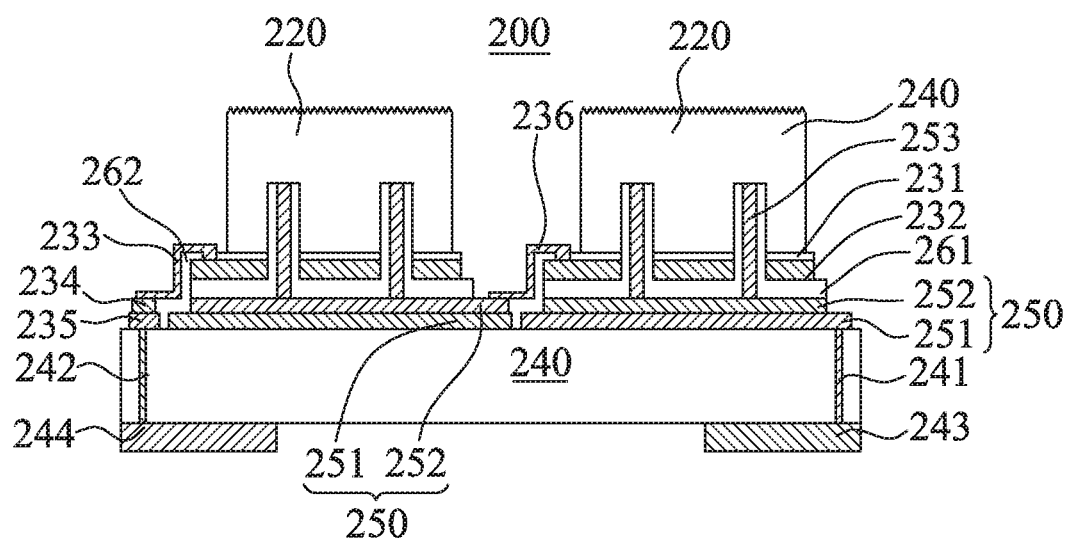
FIG. 4 is a schematic sectional view illustrating a third embodiment of the light emitting device according to the present disclosure.

Referring to FIG. 4, a third embodiment of the light emitting device 200 according to the present disclosure is shown, and is generally similar to the first embodiment except for the following differences.

In the third embodiment, the light emitting device 200 further includes a plurality of the light emitting and connecting units (for instance, two of such units) that are connected in series or in parallel. The first contact member 241 of the insulating substrate 240 is electrically connected with one of the metallic connecting layer structures 250 of the light emitting and connecting units. The first and second contact members 241, 242 are disposed outside the imaginary projections (P1) of the epitaxial layer structures 220 on the main substrate body of the insulating substrate 240.

In the third embodiment, when the light emitting and connecting units are connected in series, a lateral member 233 is disposed laterally of the corresponding one of the epitaxial layer structures 220, and extends from the corresponding third metallic layer 232 toward and is electrically connected with the second contact member 242 of the insulating substrate 240. Furthermore, another lateral member 236 is disposed laterally of the corresponding one of the epitaxial layer structures 220, and extends from the corresponding third metallic layer 232 toward and is electrically connected with the second metallic layer 252 of an adjacent one of the metallic connecting layer structures 250.

Figure 5:
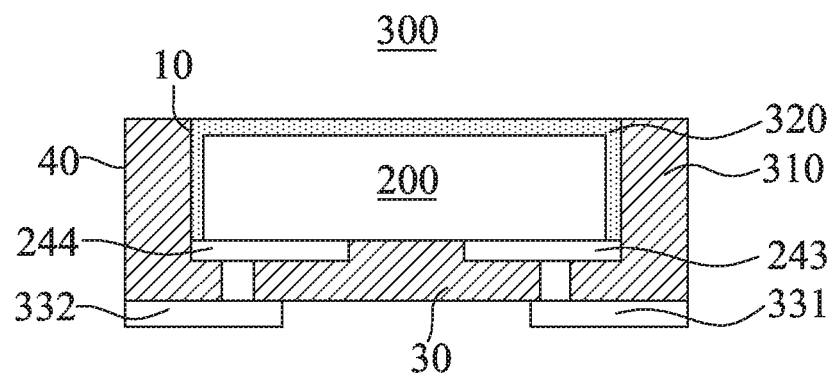
FIG. 5 is a schematic sectional view illustrating a first embodiment of a light emitting apparatus according to the present disclosure.

Referring to FIG. 5, a first embodiment of a light emitting apparatus 300 is shown, and includes one light emitting device 200 as described above, a supporting frame 310 that has an accommodation chamber 10 for receiving the light emitting device 200, a wavelength conversion layer 320 that is disposed over the light emitting surface of the epitaxial layer structure 220 of the light emitting device 200 and in the accommodation chamber 10, and two external electrodes 331, 332 that are disposed on the supporting frame 310 outside the accommodation chamber 10, and that are respectively electrically coupled with the first and second welding electrodes 243, 244. Specifically, the light emitting device 200 is surface-mounted on the supporting frame 310 in the accommodation chamber 10 (i.e. mounted on an inner surface of a bottom wall 30 of the supporting frame 310).

In the first embodiment of the light emitting apparatus 300, the light emitting device 200 may be configured to emit light at an angle of not greater than 120°.

In the first embodiment of the light emitting apparatus 300, the supporting frame 310 further has a surrounding wall 40 extending from the bottom wall 30 to cooperate with the bottom wall 30 for defining the accommodation chamber 10. A top surface of the surrounding wall 40 is not lower than a top surface of the wavelength conversion layer 320, or, alternatively, is slightly lower than the top surface of the wavelength conversion layer 320.

In the first embodiment of the light emitting apparatus 300, the light emitting apparatus 300 may be configured to be a point light source, and to have a light emission area that is substantially the same as that of the light emitting device 200. Therefore, such light emitting apparatus 300 can be applied to a backlight module suitable for a thin display (such as a direct backlight module) which can be equipped with a small-size lens to reduce the thickness of a display panel.

Figure 6:
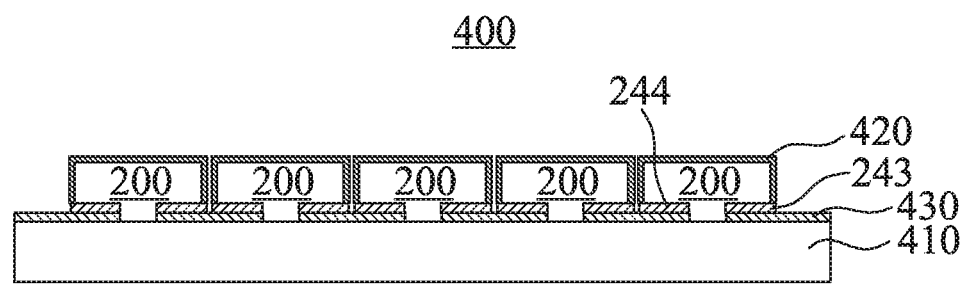
FIG. 6 is a schematic sectional view illustrating a second embodiment of the light emitting apparatus according to the present disclosure.

Referring to FIG. 6, a second embodiment of the light emitting apparatus 400 according to the present disclosure is shown, and includes a plurality of light emitting devices 200 as described above, a supporting base 410 on which the light emitting devices 200 are surface-mounted, a patterned solder layer 430 through which the light emitting devices 200 are surface-mounted on the supporting base 410, and a plurality of wavelength conversion layers 420 that are respectively disposed over the epitaxial layer structures 220 of the light emitting devices 200. Specifically, the welding electrodes 243, 244 of the light emitting devices 200 are connected to the patterned solder layer 430, and the wavelength conversion layers 420 are disposed over the light emitting surfaces 221 and lateral sides of the epitaxial layer structures 220 of the respective light emitting devices 200.

In the second embodiment of the light emitting apparatus 400, the supporting base 410 is linear, such that the light emitting apparatus 400 is configured to be a linear lighting apparatus applicable to a backlight module for a smart phone or a laptop computer.

In the second embodiment of the light emitting apparatus 400, each of the light emitting devices 200 may be configured to have a driving current density of not less than 1.5 A/mm$^2$, for instance, not less than 3 A/mm$^2$.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting device comprising:
   at least one light emitting and connecting unit including an epitaxial layer structure that includes an active layer, and a metallic connecting layer structure, said metallic connecting layer structure including a first metallic layer; and
   an insulating substrate including a main substrate body that has a first surface and a second surface opposite to each other, and a first contact member and a second contact member that each extend from said first surface to said second surface,
   wherein said metallic connecting layer structure is interposed between and interconnects said epitaxial layer structure and said main substrate body of said insulating substrate, said first metallic layer being disposed on said first surface of said main substrate body of said insulating substrate, an imaginary projection of said first metallic layer on said main substrate body of said insulating substrate completely covering and being larger in size than an imaginary projection of said epitaxial layer structure on said main substrate body of said insulating substrate, said first contact member of said insulating substrate being electrically connected with said metallic connecting layer structure, said first and second contact members being disposed outside the imaginary projection of said epitaxial layer structure on said main substrate body of said insulating substrate.

2. The light emitting device as claimed in claim 1, wherein said metallic connecting layer structure further includes a second metallic layer disposed on said first metallic layer opposite to said main substrate body of said insulating substrate, said epitaxial layer structure having a light emitting surface and a back surface that is opposite thereto, and that is for connection with said metallic connecting layer structure, said back surface of said epitaxial layer structure being entirely disposed on said second metallic layer.

3. The light emitting device as claimed in claim 2, wherein the imaginary projection of said first metallic layer on said main substrate body of said insulating substrate covers an imaginary projection of said second metallic layer on said main substrate body of said insulating substrate.

4. The light emitting device as claimed in claim 2, wherein an imaginary projection of said second metallic layer on said main substrate body of said insulating substrate covers the imaginary projection of said epitaxial layer structure on said main substrate body of said insulating substrate, the imaginary projection of said first metallic layer on said main substrate body of said insulating substrate covering the imaginary projection of said second metallic layer on said main substrate body of said insulating substrate.

5. The light emitting device as claimed in claim 2, wherein said second metallic layer has a metallic reflection sublayer.

6. The light emitting device as claimed in claim 2, wherein said epitaxial layer structure further includes a first-type semiconductor layer and a second-type semiconductor layer between which said active layer is disposed, said first-type semiconductor layer and said second-type semiconductor layer being disposed distal from and proximal to said insulating substrate, respectively, said at least one light emitting and connecting unit further including at least one extension member that extends from said second metallic layer through said second-type semiconductor layer and said active layer to be electrically connected with said first-type semiconductor layer.

7. The light emitting device as claimed in claim 2, wherein said at least one light emitting and connecting unit further includes a third metallic layer that is disposed between said second metallic layer and said epitaxial layer structure, and that is electrically connected with said second contact member of said insulating substrate.

8. The light emitting device as claimed in claim 7, wherein said at least one light emitting and connecting unit further includes a lateral member that is disposed laterally of said epitaxial layer structure, and that extends from said third metallic layer toward and is electrically connected with said second contact member of said insulating substrate.

9. The light emitting device as claimed in claim 8, wherein said third metallic layer has a metallic reflection sublayer.

10. The light emitting device as claimed in claim 1, which is configured to emit light at an angle of not greater than 120°.

11. The light emitting device as claimed in claim 1, wherein an imaginary projection of said metallic connecting layer structure on said main substrate body of said insulating substrate has an area that is not less than 90% of an area of said first surface of said main substrate body of said insulating substrate.

12. The light emitting device as claimed in claim 1, further comprising a plurality of said light emitting and connecting units, said first contact member of said insulating substrate being electrically connected with one of said metallic connecting layer structures of said light emitting and connecting units, said first and second contact members being disposed outside imaginary projections of said epitaxial layer structures on said main substrate body of said insulating substrate.

13. The light emitting device as claimed in claim 12, wherein each of said metallic connecting layer structures includes a second metallic layer disposed on said first metallic layer opposite to said main substrate body of said insulating substrate, each of said epitaxial layer structures having a light emitting surface and a back surface that is opposite thereto, and that is for connection with a corresponding one of said metallic connecting layer structures, said back surface of each of said epitaxial layer structures being entirely disposed on said corresponding second metallic layer, each of said light emitting and connecting units further includes a third metallic layer that is disposed between said corresponding second metallic layer and the corresponding one of said epitaxial layer structures, and that is electrically connected with one of said second contact member of said insulating substrate and said second metallic layer of an adjacent one of said metallic connecting layer structures.

14. The light emitting device as claimed in claim 13, wherein each of said light emitting and connecting units further includes a lateral member that is disposed laterally of the corresponding one of said epitaxial layer structures, and that extends from said corresponding third metallic layer toward and is electrically connected with one of said second contact member of said insulating substrate and said second metallic layer of an adjacent one of said metallic connecting layer structures.

15. A light emitting apparatus comprising:
the light emitting device as claimed in claim 1; and
a supporting member that said light emitting device is mounted thereon.

16. The light emitting apparatus as claimed in claim 15, wherein the epitaxial layer structure of said at least one light emitting and connecting unit of said light emitting device having a light emitting surface and a back surface that is opposite thereto, and that is for connection with the metallic connecting layer structure of said light emitting and connecting unit of said light emitting device, the light emitting apparatus further comprising a wavelength conversion layer that is disposed over said light emitting surface.

17. The light emitting apparatus as claimed in claim 15, wherein said supporting member is linear, a plurality of light emitting devices being surface-mounted on said supporting member to be configured to be a linear light source.

18. The light emitting apparatus as claimed in claim 15, wherein the metallic connecting layer structure of said at least one light emitting and connecting unit of said at least one light emitting device includes the first metallic layer disposed on the first surface of the main substrate body of the insulating substrate of said light emitting device, and a second metallic layer disposed on said first metallic layer opposite to said main substrate body of said insulating substrate, the epitaxial layer structure of said at least one light emitting and connecting unit of said light emitting device having a light emitting surface and a back surface that is opposite thereto, and that is for connection with said metallic connecting layer structure, said back surface of said epitaxial layer structure being entirely disposed on said second metallic layer.

19. The light emitting apparatus as claimed in claim 18, wherein the imaginary projection of said first metallic layer on said main substrate body of said insulating substrate covers an imaginary projection of said second metallic layer on said main substrate body of said insulating substrate.

20. The light emitting apparatus as claimed in claim 18, wherein an imaginary projection of said second metallic layer on said main substrate body of said insulating substrate covers the imaginary projection of said epitaxial layer structure on said main substrate body of said insulating substrate, the imaginary projection of said first metallic layer on said main substrate body of said insulating substrate covering the imaginary projection of said second metallic layer on said main substrate body of said insulating substrate.

* * * * *